US006922077B2

(12) United States Patent
Chandler et al.

(10) Patent No.: US 6,922,077 B2
(45) Date of Patent: Jul. 26, 2005

(54) HYBRID COMPENSATED BUFFER DESIGN

(75) Inventors: James E. Chandler, Mission Viejo, CA (US); John F. Zumkehr, Orange, CA (US); Arnaud Forestier, Santa Ana, CA (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 10/608,633

(22) Filed: Jun. 27, 2003

(65) Prior Publication Data

US 2004/0263204 A1 Dec. 30, 2004

(51) Int. Cl.[7] .......................................... H03K 19/003
(52) U.S. Cl. ............................ 326/30; 326/32; 326/33; 326/34; 326/87
(58) Field of Search ............... 326/30–34, 87, 326/90

(56) References Cited

U.S. PATENT DOCUMENTS 5,559,441 A  9/1996 Desroches
6,133,749 A * 10/2000 Hansen et al. ............... 326/30
6,486,698 B2 * 11/2002 Yanagawa .................... 326/30
2001/0000951 A1  5/2001 Welch et al.
2002/0101278 A1  8/2002 Schultz et al.

FOREIGN PATENT DOCUMENTS

EP  0 913 943 A2  6/1999

OTHER PUBLICATIONS

PCT Written Opinion, PCT Search Report, PCT/US2004/018417, 8 pages. Sep. 6, 2004.

* cited by examiner

Primary Examiner—Anh Q. Tran
(74) Attorney, Agent, or Firm—Blakely, Sokoloff, Taylor & Zafman LLP (57) ABSTRACT

According to one embodiment of the present invention, a circuit is disclosed. The circuit includes a plurality of driver slices, a portion of the plurality of the devices being used to provide a target impedance; a digital matching logic to select the portion of the plurality of the driver slices; and an analog matching circuit to produce a bias voltage to match pull-up and pull-down.

30 Claims, 6 Drawing Sheets

HYBRID COMPENSATED BUFFER DESIGN

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention generally relates to the field of electronic circuitry. More particularly, an embodiment of the present invention relates to hybrid impedance compensated buffers.

BACKGROUND

Relatively high speed interfaces that use push-pull drivers such as double data rate (DDR) and DDR II memory controllers require impedance control of the I/O buffers to meet the signal integrity requirements of the interface. These interfaces generally use a reference voltage (Vref) that is centered at a mid-point of the voltage swing of the driver generating the signal.

There are two important requirements for the driver impedance control. The first requirement is that the drivers maintain tight matching of the pull-up and pull-down impedance so that the center of the voltage swing of the driver is close to the reference voltage point to maximize the voltage margin. This can be critical when dealing with signal integrity problems such as ring back.

The second important requirement for impedance control of the buffer is to maintain overall target impedance for the driver. For example, the driver may need to have an impedance of 18 Ohms +/−10%. This tolerance is looser than the requirement for pull-up/pull-down impedance matching.

Generally, a smaller die area lowers the manufacturing cost of the memory controller. As such, to drive down costs, the amount of area available to support a driver may be limited. This can be at odds with the requirement for impedance control as seen in the prior art.

One current approach to solve this problem is to use digitally controlled legs that are switched in as needed to match the target impedance. In such a solution, the control lines for the pull-up and pull-down are generally separate because the impedance characteristics for the pull-up are often times different than that of the pull-down for all process, voltage, and temperature (PVT) cases.

Digital leg selection provides relatively smaller driver sizes. The pure digital method, however, requires fine granularity to enable the pull-up and pull-down to be matched closely. The required number of independent lines for pull-down and pull-up leg selection can also cause problems with routing.

Another approach is to use a pure analog method. In this case, analog biases are adjusted to give the desired pull-up and pull-down impedance. This method provides relatively lower number of control lines with fine granularity. However, this method potentially requires a larger size driver size, in part, because the pull-up and pull-down transistors need to be increased to reach the desired impedance.

BRIEF DESCRIPTION OF THE DRAWINGS

The invention is illustrated by way of example and not limitation in the figures of the accompanying drawings, in which like references indicate similar or identical elements, and in which.

DETAILED DESCRIPTION

In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
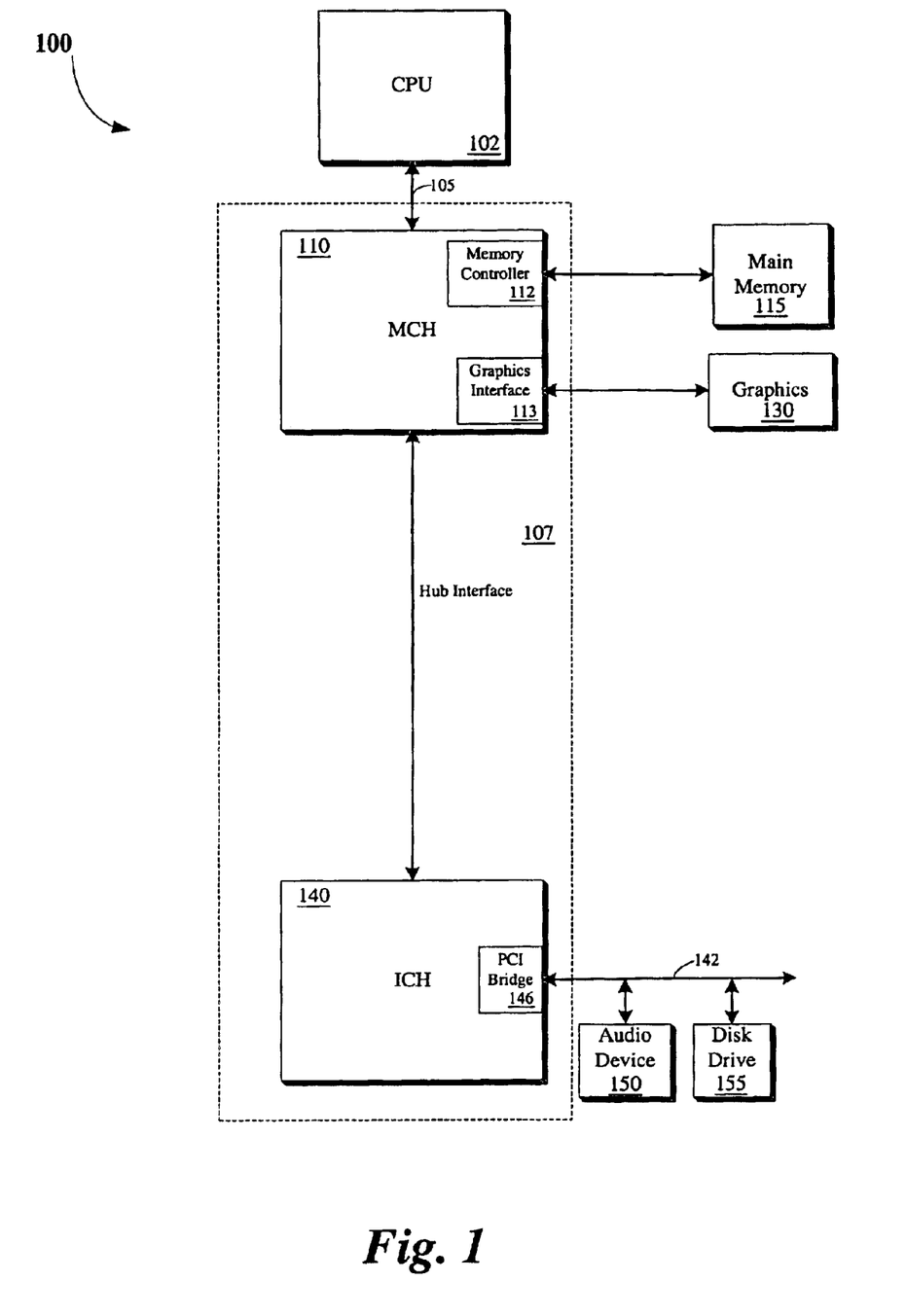
FIG. 1 illustrates an exemplary block diagram of a computer system 100 in accordance with an embodiment of the present invention.

FIG. 1 illustrates an exemplary block diagram of a computer system 100 in accordance with an embodiment of the present invention. The computer system 100 includes a central processing unit (CPU) 102 coupled to a bus 105. In one embodiment, the CPU 102 is a processor in the Pentium® family of processors including the Pentium® II processor family, Pentium® III processors, Pentium® IV processors available from Intel Corporation of Santa Clara, Calif. Alternatively, other CPUs may be used, such as Intel's XScale processor, Intel's Banias Processors, ARM processors available from ARM Ltd. of Cambridge, the United Kingdom, or OMAP processor (an enhanced ARM-based processor) available from Texas Instruments, Inc., of Dallas, Tex.

A chipset 107 is also coupled to the bus 105. The chipset 107 includes a memory control hub (MCH) 110. The MCH 110 may include a memory controller 112 that is coupled to a main system memory 115. Main system memory 115 stores data and sequences of instructions that are executed by the CPU 102 or any other device included in the system 100. In one embodiment, main system memory 115 includes dynamic random access memory (DRAM); however, main system memory 115 may be implemented using other memory types. Additional devices may also be coupled to the bus 105, such as multiple CPUs and/or multiple system memories.

The MCH 110 may also include a graphics interface 113 coupled to a graphics accelerator 130. In one embodiment, graphics interface 113 is coupled to graphics accelerator 130 via an accelerated graphics port (AGP) that operates according to an AGP Specification Revision 2.0 interface developed by Intel Corporation of Santa Clara, Calif. In an embodiment of the present invention, a flat panel display may be coupled to the graphics interface 113 through, for example, a signal converter that translates a digital representation of an image stored in a storage device such as video memory or system memory into display signals that are interpreted and displayed by the flat-panel screen. It is envisioned that the display signals produced by the display device may pass through various control devices before being interpreted by and subsequently displayed on the flat-panel display monitor.

In addition, the hub interface couples the MCH 110 to an input/output control hub (ICH) 140 via a hub interface. The ICH 140 provides an interface to input/output (I/O) devices within the computer system 100. The ICH 140 may be coupled to a Peripheral Component Interconnect (PCI) bus adhering to a Specification Revision 2.1 bus developed by the PCI Special Interest Group of Portland, Oreg. Thus, the ICH 140 includes a PCI bridge 146 that provides an interface to a PCI bus 142. The PCI bridge 146 provides a data path between the CPU 102 and peripheral devices.

The PCI bus 142 includes an audio device 150 and a disk drive 155. However, one of ordinary skill in the art will appreciate that other devices may be coupled to the PCI bus 142. In addition, one of ordinary skill in the art will recognize that the CPU 102 and MCH 110 could be combined to form a single chip. Furthermore, graphics accelerator 130 may be included within MCH 110 in other embodiments.

In addition, other peripherals may also be coupled to the ICH 140 in various embodiments. For example, such peripherals may include integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Moreover, the computer system 100 is envisioned to receive electrical power from one or more of the following sources for its operation: a battery, alternating current (AC) outlet (e.g., through a transformer and/or adaptor), automotive power supplies, airplane power supplies, and the like.

Figure 2:
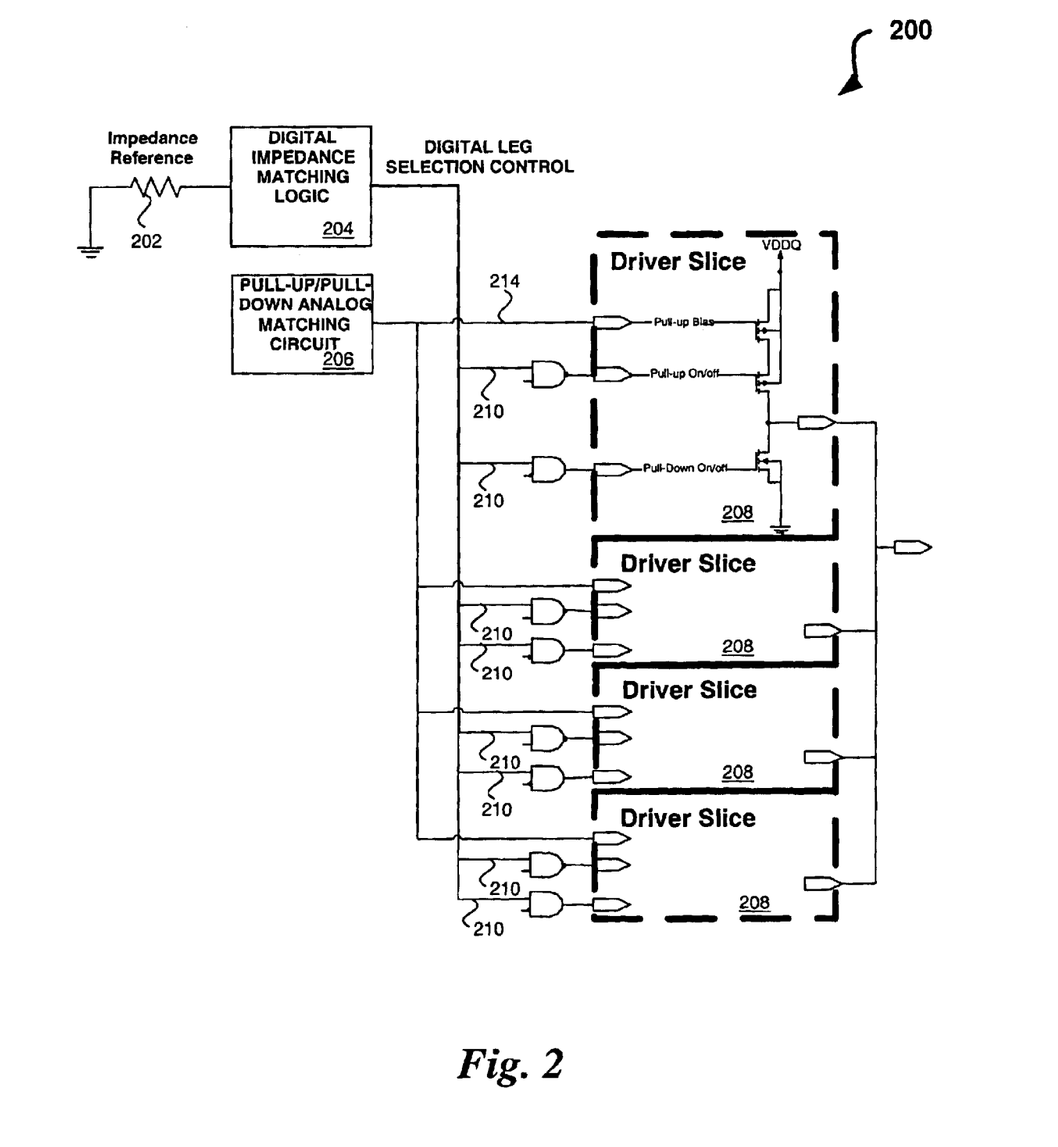
FIG. 2 illustrates an exemplary hybrid compensated buffer circuit 200 in accordance with an embodiment of the present invention.

FIG. 2 illustrates an exemplary hybrid compensated buffer circuit 200 in accordance with an embodiment of the present invention. The circuit 200 includes an impedance reference 202, which is coupled between the ground and digital impedance matching logic 204. The circuit 200 further includes a pull-up/pull-down analog matching circuit 206 and two or more driver slices 208.

It is envisioned that the driver slices may be digitally selectable slices (e.g., by utilizing 204) that have analog pull-up/pull-down matching in each slice (e.g., by utilizing 206). In various embodiments of the present invention, the slices are binary weighted or equal weight depending on design requirements. It is also envisioned that there could also be more than four slices if needed. For the embodiment of the invention shown in FIG. 2, only one digital selection line (210) and one analog bias line (214) are needed to properly control the impedance of the drivers.

In one embodiment of the present invention, the driver slices 208 are connected together at the output pad. In accordance with another embodiment of the present invention, the output impedance is controlled by turning on the appropriate number of driver slices 208. It is envisioned that the driver slices 208 may be built with adjustable P-type or N-type output stages (as will be discussed with respect to FIGS. 3 and 4, respectively).

Figure 3:
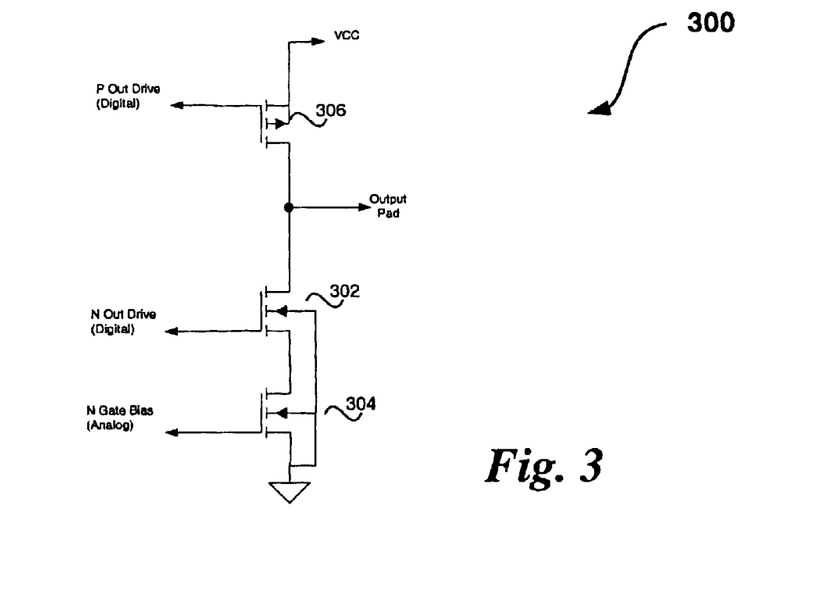
FIG. 3 illustrates an exemplary circuit diagram of an N-type output stage circuit 300 in accordance with an embodiment of the present invention.

FIG. 3 illustrates an exemplary circuit diagram of an N-type output stage circuit 300 in accordance with an embodiment of the present invention. In one embodiment of the present invention, the circuit 300 illustrates an implementation of the driver slice 208 of FIG. 2. The circuit 300 includes two N-type transistors (302 and 304) and one P-type transistor 306 coupled between a power source (Vcc) and ground.

In accordance with an embodiment of the present invention, the transistors utilized are field-effect transistors (FETs) such as metal-oxide semiconductor FETs (MOSFETs). In another embodiment of the present invention, an analog bias voltage (at the gate of the transistor 304) is applied to the N-type output stage to match its strength to the P-type output transistor (at the gate of the transistor 306).

Figure 4:
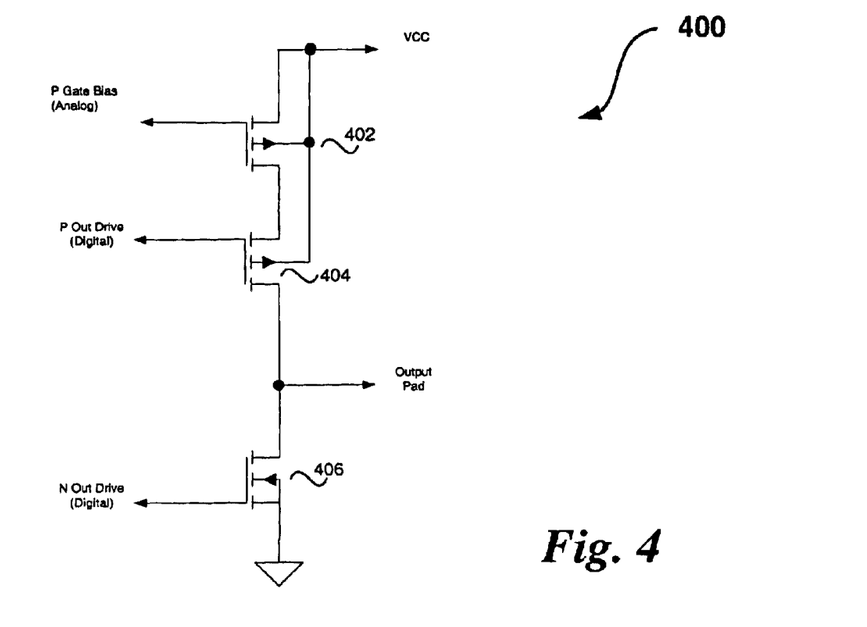
FIG. 4 illustrates an exemplary circuit diagram of a P-type output stage circuit 400 in accordance with an embodiment of the present invention.

FIG. 4 illustrates an exemplary circuit diagram of a P-type output stage circuit 400 in accordance with an embodiment of the present invention. In one embodiment of the present invention, the circuit 400 illustrates an implementation of the driver slice 208 of FIG. 2. The circuit 400 includes two P-type transistors (402 and 404) and one N-type transistor 406 coupled between a power source (Vcc) and ground.

In accordance with an embodiment of the present invention, the transistors utilized herein may be field-effect transistors (FETs) such as metal-oxide semiconductor FETs (MOSFETs). In another embodiment of the present invention, an analog bias voltage (at the gate of the transistor 402) is applied to the P-type output stage to match its strength to the N-type output transistor (at the gate of the transistor 406). With respect to various embodiments of the present invention (such as those discussed with respect to FIG. 4), an adjustable pull-up (P MOSFET) may be utilized.

Figure 5:
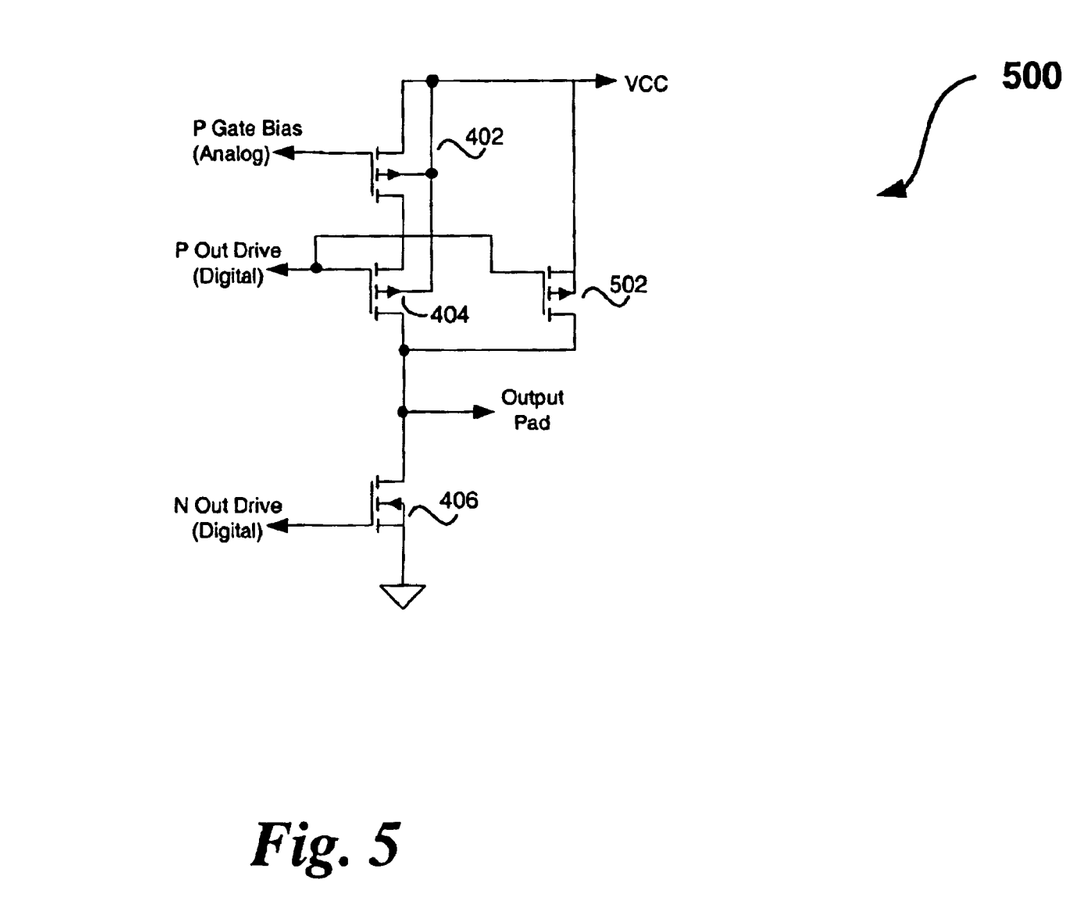
FIG. 5 illustrates an exemplary circuit diagram of a P-type output stage circuit 500 in accordance with an embodiment of the present invention.

FIG. 5 illustrates an exemplary circuit diagram of a P-type output stage circuit 500 in accordance with an embodiment of the present invention. In one embodiment of the present invention, the circuit 500 illustrates an implementation of the driver slice 208 of FIG. 2. The circuit 500 includes a parallel transistor 502 in part to help reduce the size associated with the circuit 400 of FIG. 4. More specifically, since the adjustable stage of the circuit 400 includes two transistors in series (i.e., 402 and 404), their size will be approximately twice as large as it would be if the transistors were non-adjustable. As illustrated, the transistor 502 is coupled between Vcc and the output pad with its gate coupled to the gate of the transistor 404. In another embodiment of the present invention, the size may be determined such that the output stage may be balanced for process, voltage, and/or temperature variations.

Figure 6:
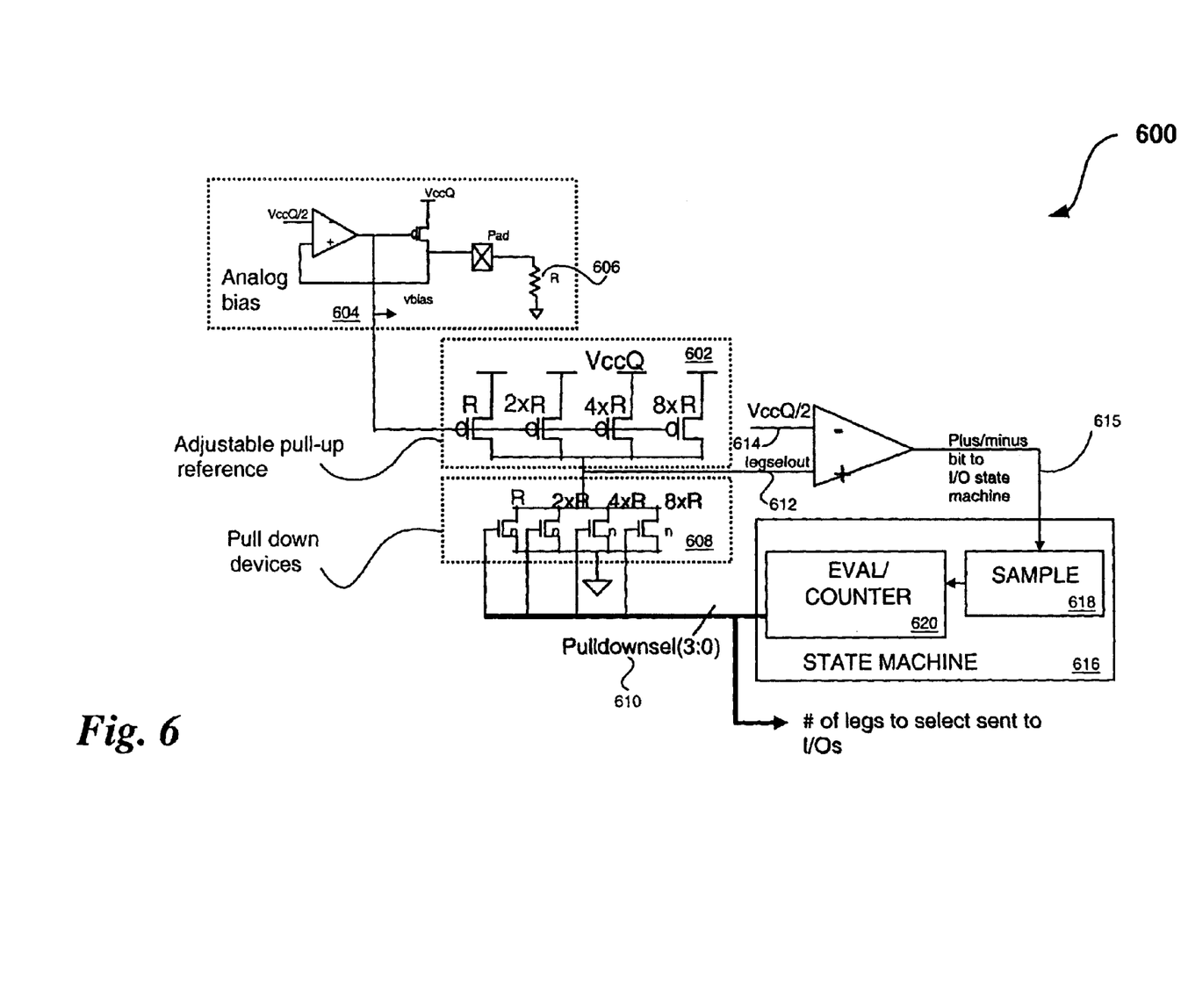
FIG. 6 illustrates an exemplary slice enablement circuit 600 in accordance with an embodiment of the present invention.

FIG. 6 illustrates an exemplary slice enablement circuit 600 in accordance with an embodiment of the present invention. In one embodiment of the present invention, the circuit 600 is an implementation for the digital impedance matching logic 204 of FIG. 2. To digitally select the number of slices needed to achieve a target impedance, an impedance reference may be used. In accordance with an embodiment of the present invention, such as that illustrated in FIG. 6, this is done by tuning a pull-up device 602 against an analog bias 604 (e.g., in relation to an external/reference resistor such as resistor 202 of FIG. 2). The analog bias 604 further includes a resistor 606. As illustrated in FIG. 6, the resulting bias signal may be applied to several other pull-up devices (such as transistors) that are binary sized, for example, to enable selection of a wide range of target impedances to tune against.

In one embodiment of the present invention, the binary sized pull-down devices 608 are then digitally tuned against the pull-up reference. These pull-down devices 608 may be representative of the pull-down strength of the actual driver with an impedance granularity equal to half that of the slice of the real driver. In an embodiment of the present invention, this is done by applying a code (Pulldownsel 610) to turn on more or less pull-down devices 608 and check if the voltage between pull-up 602 and pull-down 608 devices (e.g., by using a legselout signal 612 on the figure) is above or below a reference 614 (e.g., VccQ/2). A plus/minus bit 615 may then be provided to a state machine 616. The state machine 616 may be viewed as a sample flop (618) and an up-down counter (620). In an embodiment of the present invention, several sample flops (618) may be used to avoid metastability.

In accordance with embodiments of the present invention, the circuit 600 is envisioned to provide several features to avoid "hunting" due to granularity of the impedance measurement and sampling noise. Generally, hunting exists when the digital controls are constantly toggling between the same two values even though no change in PVT has occurred. In one embodiment of the present invention, one feature is that the granularity of the comparison is half that of the driver slice granularity. When used with a rounding function, toggling that is occurring on the pull-down controls is not envisioned to affect the actual controls used to select the slices. In a further embodiment of the present invention, the other feature is a digital filter that reduces the response of the system for a sample that had noise in it.

In another embodiment of the present invention, the target impedance is selected based on a calibrated source and/or a look-up table. In yet another embodiment of the present invention, the digital matching logic includes a circuit to compare a reference scaled by a target code with a binary-weighted slice structure. In a different embodiment of the present invention, the digital matching logic includes a state machine to sample the comparison. In yet another embodiment of the present invention, the binary-weighted slice structure has a fixed percentage (e.g., half slice) minimum weighting. In a further embodiment of the present invention, the digital matching logic includes a digital filter to reduce comparison related noise.

In one embodiment of the present invention, the code applied to the pull-down devices 608 translates directly into the number of driver slices that need to be enabled. This may be achieved by carefully selecting device sizes. By having a calibrated code selectable reference pull-up and a fixed size ratio between driver slice pull-down devices and tuning pull-down devices, it is envisioned that the drivers may be adjusted to any selectable impedance. This may be limited by process and driver size in an embodiment of the present invention. In a further embodiment of the present invention, setting the external/reference resistor value (e.g., 202 of FIG. 2) and/or the adjustable pull-up reference code sets the target impedance to an optimal value.

Figure 7:
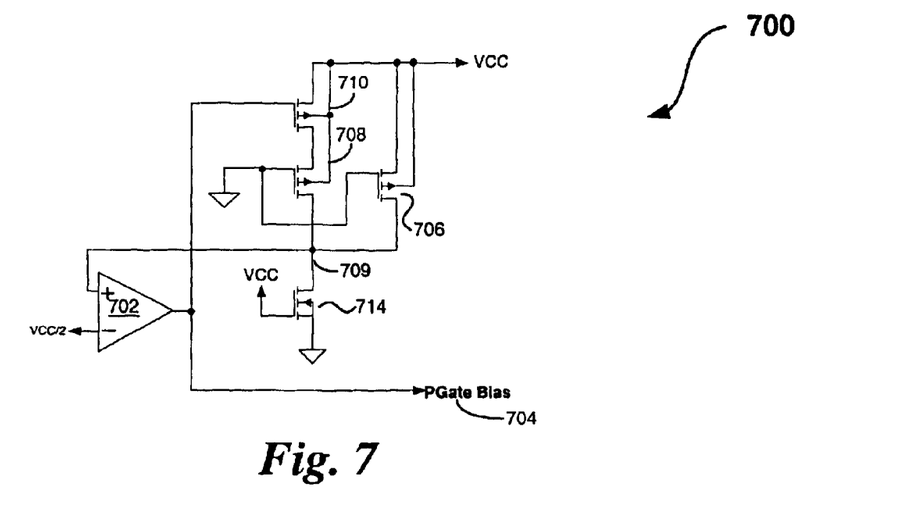
FIGS. 7 and 8 illustrate exemplary pull-up/pull-down analog matching bias circuits 700 for adjustable pull-up (FIG. 7) and adjustable pull-down (FIG. 8) in accordance with embodiments of the present invention.
Figure 8:
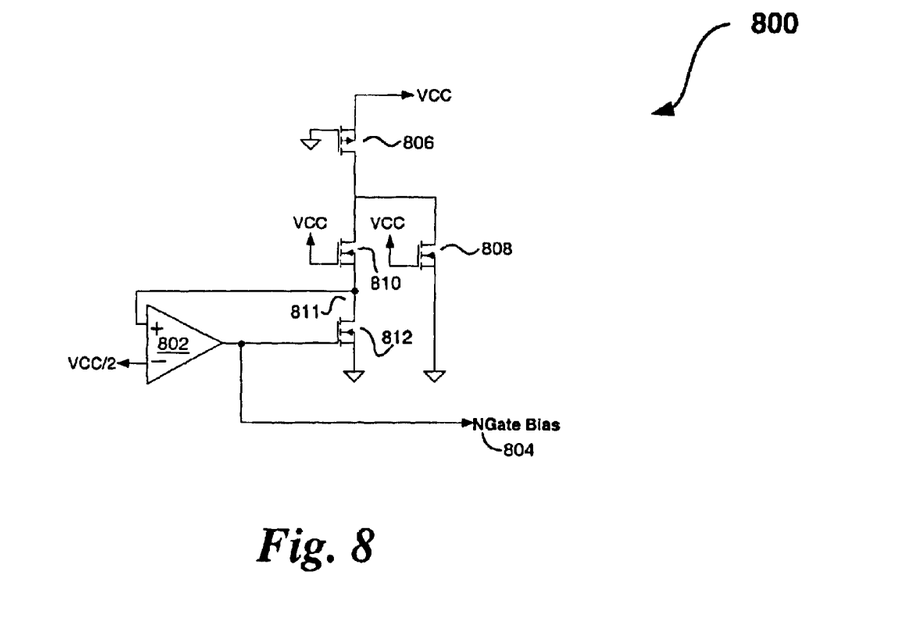

FIGS. 7 and 8 illustrate exemplary pull-up/pull-down analog matching bias circuits 700 for adjustable pull-up (FIG. 7) and adjustable pull-down (FIG. 8) in accordance with embodiments of the present invention. In one embodiment of the present invention, the circuits 700 and 800 may be utilized to implement the pull-up/pull-down analog matching circuit 206 of FIG. 2. As illustrated in FIGS. 7 and 8, the pull-up/pull-down matching may be accomplished by an analog control loop.

In an embodiment of the present invention, transistors are scaled and configured to match the driver slices. Op-amps (702 and 802) are used to generate the gate bias (704 and 804, respectively) needed to maintain a constant voltage (e.g., VccQ/2) across the voltage divider formed by the pull-up (602 of FIG. 6) and pull-down (608 of FIG. 6) devices. In another embodiment of the present invention, the generated gate voltage is applied to all of the driver slices. Due to non-linear effects caused by the devices saturating, it may be necessary to trim the output stage or use a different reference voltage other than Vcc/2.

In one embodiment of the present invention, the circuit 700 includes a transistor 706 coupled between Vcc and a node 709 (which also provides an input of the op-amp 702). The circuit 700 further includes a transistor 708, which is coupled between the node 709 and a transistor 710. The gates of the transistors 706 and 708 are grounded. The gate of the transistor 710 is coupled to the output of the op-amp 702 (704). The circuit 700 also includes a transistor 714 coupled between the node 709 and ground. The gate of the transistor 714 is coupled to Vcc.

In one embodiment of the present invention, the circuit 800 includes a transistor 806 coupled between Vcc and transistors 808 and 810. The gate of the transistor 806 is grounded. The transistor 808 is also coupled to a node 811 (which also provides an input of the op-amp 802). The transistor 810 is coupled to ground as illustrated. The gates of the transistors 808 and 810 are both coupled to Vcc. The circuit 700 further includes a transistor 812, which is coupled between the node 811 and ground. The gate of the transistor 812 is coupled to the output of the op-amp 802 (804). As illustrated in FIGS. 7 and 8, both op-amps (702 and 802) receive Vcc/2 as their inputs also.

In a further embodiment of the present invention, it is envisioned that the average mismatch may be reduced to an average of 7 mV over design corners when using the analog technique (such as those discussed with respect to FIGS. 7 and 8). With 1.8 V signaling levels, this represents an error of less than 0.4%.

In accordance with an embodiment of the present invention, a hybrid impedance compensated buffer is disclosed which operates as a combined pure digital and pure analog design to produce a calibrated driver with small area while maintaining excellent pull-up/pull-down matching. In a further embodiment of the present invention, the pull-up impedance is relatively precisely matched to the pull-down by an analog control loop while the target impedance of the overall buffer is determined by a digital control loop. In accordance with another embodiment of the present invention, this results in a driver that has the relatively precise matching of an analog circuit but with the reduced area such as that of the digital method.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. A circuit comprising:
   a plurality of driver slices, a portion of the plurality of the driver slices being used to provide a target impedance;
   a digital matching logic to select the portion of the plurality of the driver slices; and
   an analog matching circuit to produce a bias voltage to match pull-up and pull-down.

2. The circuit of claim 1 wherein the digital matching logic selects the portion of the plurality of the driver slices based on one or more items selected from a group comprising a target impedance and a reference resistor.

3. The circuit of claim 2 wherein the target impedance is determined through a dial-in code.

4. The circuit of claim 2 wherein the target impedance is selected based on one or more items selected from a group comprising a calibrated source and a look-up table.

5. The circuit of claim 1 wherein the digital matching logic includes a circuit to compare a reference scaled by a target code with a binary-weighted pull-up/pull-down structure.

6. The circuit of claim 5 wherein the digital matching logic includes a state machine to sample the comparison.

7. The circuit of claim 5 wherein the binary-weighted pull-up/pull-down structure has a fixed percentage minimum weighting.

8. The circuit of claim 1 wherein the digital matching logic includes a digital filter to reduce comparison related noise.

9. The circuit of claim 1 wherein the digital matching logic includes a rounding function to prevent hunting.

10. The circuit of claim 1 wherein each driver slice includes an uncompensated leg and a compensated leg.

11. The circuit of claim 2 wherein the uncompensated leg includes a circuit selected from a group comprising a pull-down circuit and a pull-up circuit.

12. The circuit of claim 2 wherein the compensated leg includes a circuit selected from a group comprising a pull-down circuit and a pull-up circuit.

13. The circuit of claim 2 wherein the compensated leg is compensated by an analog control voltage.

14. The circuit of claim 1 wherein the circuit is selected from a group comprising a driver and a buffer.

15. The circuit of claim 1 wherein the bias voltage matches pull-up to pull-down.

16. The circuit of claim 1 wherein the analog matching circuit operates independently from a number of driver slices.

17. The circuit of claim 1 wherein the bias voltage is distributed to all input/output (I/O) drivers.

18. The circuit of claim 1 wherein the pull-up and pull-down are compared at a given reference output voltage.

19. A method comprising:
providing a plurality of driver slices;
using a portion of the plurality of the driver slices to provide a target impedance;
providing digital matching logic to select the portion of the plurality of the driver slices; and
providing an analog matching circuit to produce a bias voltage to match pull-up and pull-down.

20. The method of claim 19 wherein the digital matching logic selects the portion of the plurality of the driver slices based on one or more items selected from a group comprising a target impedance and a reference resistor.

21. The method of claim 20 wherein the target impedance is determined through a dial-in code.

22. The method of claim 20 wherein the target impedance is selected based on one or more items selected from a group comprising a calibrated source and a look-up table.

23. The method of claim 19 wherein the digital matching logic compares a reference scaled by a target code with a binary-weighted pull-up/pull-down structure.

24. The method of claim 23 wherein the digital matching logic samples the comparison.

25. The method of claim 23 wherein the binary-weighted pull-up/pull-down structure has a fixed percentage minimum weighting.

26. The method of claim 19 wherein the digital matching logic provides a digital filter to reduce comparison related noise.

27. The method of claim 19 wherein the digital matching logic prevents hunting.

28. A computer system comprising:
a central processing unit (CPU);
a display device coupled to the CPU to display an image;
a plurality of driver slices, a portion of the plurality of the driver slices being used to provide a target impedance;
a digital matching logic to select the portion of the plurality of the driver slices; and
an analog matching circuit to produce a bias voltage to match pull-up and pull-down.

29. The computer system of claim 28 further including a main memory coupled to the CPU.

30. The computer system of claim 28 further including a memory coupled to the display device to store the image.

* * * * *

UNITED STATES PATENT AND TRADEMARK OFFICE
CERTIFICATE OF CORRECTION

PATENT NO. : 6,922,077 B2
DATED : July 26, 2005
INVENTOR(S) : Chandler et al.

It is certified that error appears in the above-identified patent and that said Letters Patent is hereby corrected as shown below:

Title page,
Item [57], ABSTRACT,
Line 3, delete "devices" and insert -- driver slices --.

Signed and Sealed this

Twenty-seventh Day of September, 2005

JON W. DUDAS
*Director of the United States Patent and Trademark Office*